(12) United States Patent
Bosch et al.

(10) Patent No.: US 7,726,011 B2
(45) Date of Patent: Jun. 1, 2010

(54) CHIP TRANSFER METHOD AND APPARATUS

(75) Inventors: Johannes Wilhelmus Dorotheus Bosch, Nijmegen (NL); Wilhelmus Johannus Theodorus Derks, Nijmegen (NL); Antonius Hendrikus Jozef Kamphuis, Nijmegen (NL); Thomas Markus Kampschreur, Nijmegen (NL); Joep Stokkermans, Nijmegen (NL); Leon Wetzels, Elst (NL)

(73) Assignee: NXP B.V., Eindhoven (NL)

( * ) Notice: Subject to any disclaimer, the term of this patent is extended or adjusted under 35 U.S.C. 154(b) by 724 days.

(21) Appl. No.: 10/561,397

(22) PCT Filed: Dec. 11, 2003

(86) PCT No.: PCT/IB03/06050

§ 371 (c)(1),
(2), (4) Date: Dec. 19, 2005

(87) PCT Pub. No.: WO2004/064124

PCT Pub. Date: Jul. 29, 2004

(65) Prior Publication Data

US 2007/0137031 A1      Jun. 21, 2007

(30) Foreign Application Priority Data

Jan. 16, 2003    (EP) .................................. 03100077

(51) Int. Cl.
B23P 19/00 (2006.01)
H01R 43/00 (2006.01)
B66C 23/00 (2006.01)
B66F 9/00 (2006.01)
E02F 3/00 (2006.01)
B65G 1/133 (2006.01)

(52) U.S. Cl. ........................... 29/739; 29/827; 414/680; 414/749.4

(58) Field of Classification Search .................... 29/564, 29/739, 759, 827; 414/680, 749.4
See application file for complete search history.

(56) References Cited

U.S. PATENT DOCUMENTS

| 4,461,610 | A  | * | 7/1984 | Harigane et al. ............ 198/431 |
| 4,653,664 | A  | * | 3/1987 | Hineno et al. .................. 221/3 |
| 4,913,335 | A  | * | 4/1990 | Yoshida ...................... 228/103 |
| 6,171,049 | B1 | * | 1/2001 | Wirz et al. .................. 414/680 |
| 2002/0031423 | A1 | * | 3/2002 | Mannhart et al. ......... 414/752.1 |

FOREIGN PATENT DOCUMENTS

EP          0 312 116        4/1989

* cited by examiner

*Primary Examiner*—A. Dexter Tugbang
*Assistant Examiner*—David P Angwin

(57) ABSTRACT

In a chip transferring apparatus a wafer (44) and a lead frame (50) are positioned. A first chip (42) is picked up from the wafer (44) by a transfer head (14; 40*a*-40*d*) in a chip pick-up position, while bonding a second chip to the lead frame (50) by another transfer head in a chip bonding position. The first chip (42) is then transferred by said one of the transfer heads from the chip pick-up position to the chip bonding position. Next, the first chip (42) is bonded on the lead frame (50) by said one of the transfer heads (14; 40*a*-40*d*) in the chip bonding position, while another one of the transfer heads picks up a third chip from the wafer (44) in the chip pick-up position. Each transfer head (14; 40*a*-40*d*) comprises a collet (66*a*-66*d*) which, through a mechanical coupling, is coupled to another collet for compensating radial forces exerted on the collet relative to said axis of rotation. Vacuum is transferred to the collet from a stationary pressure source by groove sections (106) in a transfer assembly stator (100) communicating through a gap (104) between the rotatable transfer assembly (32) and the transfer assembly stator (100) with gas ducts in the transfer head (14; 40*a*-40*d*) and the corresponding collet (66*a*-66*d*). A chip (42) is picked up from a wafer (44) by a needle mechanism (224).

22 Claims, 7 Drawing Sheets

CHIP TRANSFER METHOD AND APPARATUS

The present invention relates to a method and an apparatus for transferring chips from a wafer to a lead frame. The present invention further relates to an apparatus for transferring chips from a wafer to a lead frame, the apparatus comprising transfer heads on a rotatable transfer assembly, each transfer head comprising a collet having one or more pick-up openings for picking up, holding, and releasing a chip in a transfer process by varying the pressure at the pick-up opening. The present invention further relates to a method for picking up chips.

Conventionally, semiconductor circuits are manufactured on and in a circular plane substrate, also referred to as a wafer, in a matrix having a plurality of rows and columns of such circuits which usually are all identical and usually all have the same dimensions, although these are no prerequisites. After the wafer production, a surface of the wafer is adhered to a flexible carrier film. The respective circuits are then physically separated from each other by cutting through the wafer from one surface to the opposite surface without cutting through the carrier film. Thus, a plurality of individual semiconductor circuits (hereinafter also to be referred to as "chips" or "dies") arranged on the carrier film is obtained.

In a chip bonding process, each chip is mechanically picked up and disengaged from the carrier film by a needle mechanism interacting with a transfer head of a transfer assembly, the transfer head being in a chip pick-up position. Prior to each chip pick-up process, the chip is taken to the chip pick-up position by moving the wafer. After pick-up, the chip is transferred by the transfer head to a lead frame where the chip is released from the transfer head and fixedly mounted (bonded) on the lead frame, the transfer head being in a chip bonding position. Next, contact pads of each chip are electrically connected to contact pins of the lead frame in a wire bonding process.

In a transferring device known from U.S. Pat. No. 4,913,335 the transfer assembly comprises a single arm rotatable about an axis of rotation, the arm carrying a transfer head at an end thereof facing away from the axis of rotation. The plane in which the chips surfaces of the wafer extend is essentially at right angles to the plane in which a bond surface of a lead frame extends. The plane in which the transfer head is moved is essentially at right angles to the planes mentioned before. The transfer head is moved to and fro by rotating the arm about the axis of rotation across angle of +90° between a chip pick-up position and a chip bonding position.

Comparing this device to other devices, where the chips surfaces of the wafer and the bond surface of the lead frame are essentially in the same plane, and consequently the mean travelling distance of the transfer head moving to and fro parallel to said plane increases for larger wafers, the arrangement according to the U.S. Pat. No. 4,913,335 provides a step forward in decreasing transfer head travelling distance (thus increasing the throughput (number of components processed per unit of time) of the known apparatus), and in decreasing the overall dimensions of the transfer device.

However, the known apparatus and method still has a number of disadvantages.

First, at present the throughput of the known transferring apparatus is reaching its maximum. The acceleration, speed and deceleration of the transfer assembly during the movement from the chip pick-up position to the chip bonding position are near their maximum, taking into account the maximum allowable drive motor power output and the mechanical loads to be imposed on the various components. As a result, a further increase in the performance of the known transferring apparatus is hardly obtainable.

Another important disadvantage of the known transferring apparatus is that the time needed for the transferring assembly to return the transfer head from the chip bonding position to the chip pick-up position basically is wasted time, since no useful transfer operation takes place.

Further problems in a known apparatus for transferring chips from a wafer to a lead frame arise where each transfer head on the rotatable transfer assembly comprises a collet having one or more pick-up openings for picking up, holding, and releasing a chip in a transfer process by varying the pressure at the pick-up opening. When a transfer head is in the chip pick-up position, the pick-up opening is brought into close proximity of the chip, and a low pressure ("vacuum") is generated in the opening, whereby the chip is sucked to and against the opening. While maintaining the low pressure, the chip is transferred by the transfer head to its chip bonding position. Here, in the pick-up opening a normal environmental pressure or a higher pressure is generated, causing the chip to release from the pick-up opening into a bonding position. Thus, in this transfer process, a pressure at a movable pick-up opening must be varied and maintained. Disadvantageously, this requires a complex construction for connecting one or more stationary pressure sources to the movable transfer heads, in particular transfer heads moving in only one direction, and it further requires adequate gas sealing to reduce gas and energy consumption. Conventional gas seals may be subject to wear, and therefore the apparatus will need adequate maintenance and replacement work, which is a further disadvantage.

Other problems arise in a known chip transfer apparatus, where a chip in a pick-up position mounted on a carrier film held by a vacuum head is pushed away and peeled off from the carrier film by a needle, the needle moving from a starting position and pushing the chip against a pick-up opening of a collet of a movable transfer assembly, whereby the chip is peeled off from the carrier film. Next the collet, holding the chip by a reduced pressure at the pick-up opening of the collet, is slowly moved away from the needle top, while the needle remains in place, creating a distance between the chip and the needle top. After said distance is detected, the chip is transferred from the pick-up position to a bonding position, and the needle is returned to its starting position. Then a next chip is brought into a pick-up position, and the above process is repeated.

One of the problems in the prior art chip transfer apparatus is the relatively slow, time-consuming upwards movement of the collet for creating the distance between the chip and the needle top. Another problem is the length of the overall time period necessary for picking up a chip.

An object of the invention is to provide a transferring method and apparatus providing an improved throughput.

A further object of the invention is to provide a compact transferring apparatus.

Another object of the invention is to provide a transferring apparatus comprising a rotatable transfer assembly having transfer heads with collets comprising at least one pick-up opening for picking up, transferring and releasing chips, in which apparatus a simple and reliable pressure communication from a pressure source to each pick-up opening can be made.

Another object of the invention is to shorten the time needed for picking up a chip from a carrier film by a collet, using a vacuum head and needle assembly.

One or more of the above objects are reached in the method according to the invention for transferring chips from a wafer to a lead frame, the method comprising the steps of: positioning a wafer with chips surfaces extending in a first plane; positioning a lead frame with a bond surface thereof extending in a second plane which is at a first angle of between 0° and 180° to the first plane, the first plane and the second plane intersecting at an intersection line; providing a rotatable transfer assembly with at least two transfer heads, the transfer assembly having an axis of rotation which extends in a third plane at half of the first angle to the first plane and the second plane, respectively, the axis of rotation extending at a second angle of at least 0° and at most 90° to said intersection line; picking up a first chip from the wafer by one of the transfer heads in a chip pick-up position, while bonding a second chip to the lead frame by another one of the transfer heads in a chip bonding position; transferring the first chip by said one of the transfer heads from the chip pick-up position to the chip bonding position; and bonding the first chip on the lead frame by said one of the transfer heads in the chip bonding position, while picking up a third chip from the wafer by another one of the transfer heads in the chip pick-up position.

Positioning the second plane at a first angle between 0° and 180° (preferably at 90°) to the first plane allows for a travelling distance and a travelling time for a chip from the wafer to the lead frame which can be made independent from the size of the wafer.

Furthermore, such an arrangement allows for a reduction of the travelling distance and the travelling time by placing the wafer relatively close to the lead frame.

By employing at least two transfer heads in the rotating assembly of the transferring method and apparatus according to the invention, one transfer head may be in a chip pick-up position, while at the same time another transfer head is in a chip bonding position. Thus it is possible for each position of one of the transfer heads to be useful and to make a useful transfer operation with every movement of every transfer head from the chip pick-up position to the chip bonding position.

Advantageously, the transfer heads are rotatable essentially along one circle in a fourth plane at right angles to the axis of rotation of the transfer assembly, for minimizing any movements of (parts of) the transfer head towards and away from the wafer or the chip pick-up position when picking up chips, and/or towards and away from the lead frame or the chip bonding position when bonding chips, respectively.

Preferably, although not necessarily, the transfer heads are spaced regularly along said circle. With such an arrangement, the transfer heads can be rotated in uniform indexing steps, simplifying the structure and control of the apparatus according to the invention.

For a transfer assembly having two transfer heads, preferably the spacing of the transfer heads is 180°. Thus, the transfer heads are oppositely positioned relative to the axis of rotation of the transfer assembly. In such a situation, one of the transfer heads picks up a chip from a wafer at a chip pick-up position, while concurrently the other one of the transfer heads bonds a chip on a lead frame at a chip bonding position. An indexing step for rotating the transfer assembly also is 180°, making each movement of the transfer heads useful for transferring a chip from the chip pick-up position to the chip bonding position.

For n transfer heads (n>2), the spacing between the transfer heads preferably is 360°/n. An indexing step for rotating the transfer assembly preferably is 360°/n. When the chip pick-up position is chosen one indexing step from the chip bonding position, then (n−2) position(s) is/are (an)other position(s) (not a chip pick-up position or a chip bonding position), and may be used to inspect or otherwise process or handle the chip, when the direction of rotation of the transfer assembly is chosen from the chip pick-up position via the other position(s) to the chip bonding position.

In a preferred embodiment of the transferring apparatus, the first angle between the first plane and the second plane is 90°, the second angle between the intersection line between the first plane and the second plane on the one hand, and the axis of rotation of the transfer assembly on the other hand is 0°, and the number of transfer heads is four.

In a preferred embodiment, the transfer assembly is always rotated in one direction for an optimum throughput of the transferring apparatus, avoiding movements of transfer heads without a useful transfer operation.

The transferring method and apparatus according to the present invention described above can be used in the field of die bonding as described above, but its use extends further to other transferring devices in other fields.

In a further aspect of a transferring apparatus, each rotatable transfer head comprises a collet, preferably a vacuum collet which, in the chip pick-up position, is movable in a direction at right angles to the first plane for picking up a chip from a wafer, and in the chip bonding position, is movable at right angles to the second plane for bonding a chip on a lead frame.

In a preferred embodiment, the transfer assembly comprises a counterweight for each collet, each collet being coupled to its corresponding counterweight through a mechanical coupling for compensating radial forces exerted on the collet relative to said axis of rotation. The counterweight and the mechanical coupling can be designed to compensate any centrifugal forces during rotation of the transfer assembly on the collet of the transfer head, with the result that the collet needs not be held in position during rotation of the transfer assembly by a collet drive motor.

In a preferred embodiment, the mechanical coupling is adapted to be driven by a collet drive motor for moving the collet radially relative to said axis of rotation. The transfer assembly motor and the collet drive motor advantageously have the same axis of rotation, the same direction of rotation, and the same angular speed, thereby covering the same angular path except for the time when the collet of the transfer head need be moved radially inwardly or outwardly. In such circumstances, a difference angle is created between the angular path covered by the transfer assembly motor and the angular path covered by the collet drive motor, the difference angle resulting in the desired radial collet movement.

For a minimum mass of the transfer assembly, the counterweight for one collet is another collet of the transfer assembly. Thus, a separate counterweight can be dispensed with. For a simple construction of the mechanical coupling between collets and its drive by the collet drive motor, said one collet preferably is situated oppositely relative to said other collet with respect to said axis of rotation.

In an advantageous simple, low cost and effective embodiment, the mechanical coupling is a wire.

The control of the collet drive motor may be simplified by providing a support of each collet relative to the transfer assembly with a pressure spring pretensioning the wire. The pretension force is to be greater than a bonding force to be applied on a chip on a lead frame by the collet of a transfer head. In a stationary situation, the pressure spring may bring the collet in a predetermined position. Preferably, the pressure spring has a low stiffness, so that the pretensioning force can be kept relatively constant during a displacement of each collet generated by the collet drive motor.

The novel features of counterweighting the collets and different embodiments thereof may not only be implemented in the apparatus according to the invention, but may also be implemented in a transferring apparatus according to the prior art, comprising at least one transfer head being rotatable to and fro through a limited angle.

A further object of the invention is reached by providing a transferring apparatus having a rotatable transfer assembly which is rotatable around a transfer assembly stator, a narrow circumferential gap being provided between the rotatable transfer assembly and the transfer assembly stator, the transfer assembly stator comprising groove sections facing the gap for at least the chip pick-up position and the chip bonding position, respectively, each groove section extending in the circumferential direction and being in communication with a first gas duct, each transfer head of the rotatable transfer assembly comprising at least one collet having a pick-up opening, the pick-up opening being in communication with the gap through a second gas duct. With this structure, a contactless communication between a stationary pressure source and a moving pick-up opening is established, avoiding the use of seals. Preferably, the gap is at most 20 μm, and more in particular the gap is about 15 μm to prevent any substantial loss or supply of gas, depending on the gas pressure in the gas ducts and the gap. By providing the groove sections adjacent to each other in the circumferential direction, leaving only a narrow partition wall between the groove sections and the circumferential edges of the groove sections where said gap is present, a relatively low-cost and compact structure can be obtained.

Preferably, the number of groove sections is equal to the number of transfer heads, so as to allow an individual pressure control at the collet of each transfer head.

In a preferred embodiment, each first duct is provided with one or more controllable valves each allowing a communication with a source of a predetermined pressure, like environmental pressure, low pressure or vacuum (below environmental pressure), or high pressure (above environmental pressure).

For maintaining a specific gas pressure at a pick-up opening of a transfer head moving on the rotatable transfer assembly relative to the transfer assembly stator (and, consequently, relative to the groove sections), the second gas duct at its end facing the gap is provided with a bridging groove extending in the circumferential direction, the bridging groove being adapted to bridge two adjacent groove sections of the transfer assembly stator.

It is observed that the pressure generation at the pick-up openings of the collets according to the present invention may advantageously be used in combination with the other features according to the present invention. However, the pressure generation at the pick-up openings of the collets according to the present invention may also be used independently from the other features according to the present invention.

A further object of the invention is reached in a method of picking up a chip in the chip pick-up position, the method comprising the steps of: positioning a vacuum head, holding a carrier film carrying the chip, the vacuum head comprising a needle for pushing up the chip from the carrier film; positioning a collet opposite to the chip; pushing up the chip by the needle from the carrier film against the collet; and moving the needle away from the chip. With these steps, the relatively slow upwards movement of the collet (and thus the mechanism necessary to create this movement) may be avoided. Instead, the relatively fast downwards movement of the needle is used to create a distance between the chip and the needle top, shortening the pick-up time period needed for a chip.

When during the step of moving the needle away from the chip the vacuum head is moved away from the chip, initially the chip may be positioned closer to the collet than in the prior art. In such an arrangement, the movement of the vacuum head away from the chip may be used to peel off the chip from the carrier film, thus further reducing the pick-up time period needed for a chip.

It is observed that the chip pick-up process according to the present invention may advantageously be used in combination with the other features according to the present invention. However, the chip pick-up process according to the present invention may also be used independently from the other features according to the present invention.

The claims, features and advantages of the invention will be explained by reference to the drawings, in which non-limiting embodiments are shown. In the different Figures, identical reference numerals indicate identical parts or parts having the same or similar function.

FIG. 1 schematically illustrates in perspective view a first basic arrangement for transferring chips from a wafer to a lead frame according to the invention;

FIG. 2 schematically illustrates in perspective view a second basic arrangement for transferring chips from a wafer to a lead frame according to the invention;

FIG. 3 schematically illustrates in perspective view a third basic arrangement for transferring chips from a wafer to a lead frame according to the invention;

Figure 8:
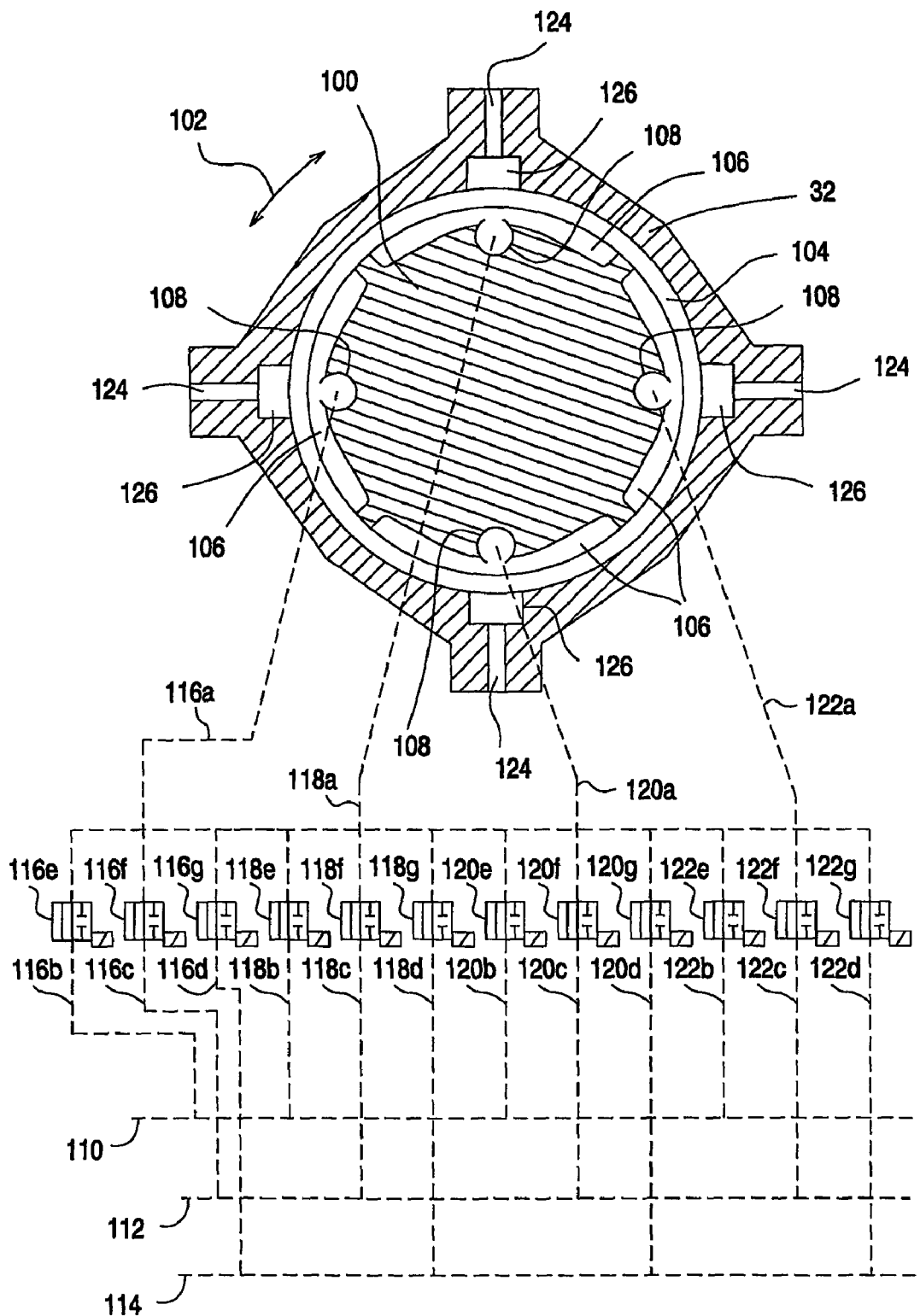

FIG. 8 in a cross-sectional view schematically illustrates the operation of a gas pressure operated pick-up opening of a collet of a transfer head of the transferring apparatus of any of FIGS. 4-7; and FIGS. 9a-9e schematically illustrate subsequent stages in a chip pick-up process by a pick-up assembly.

Figure 1:
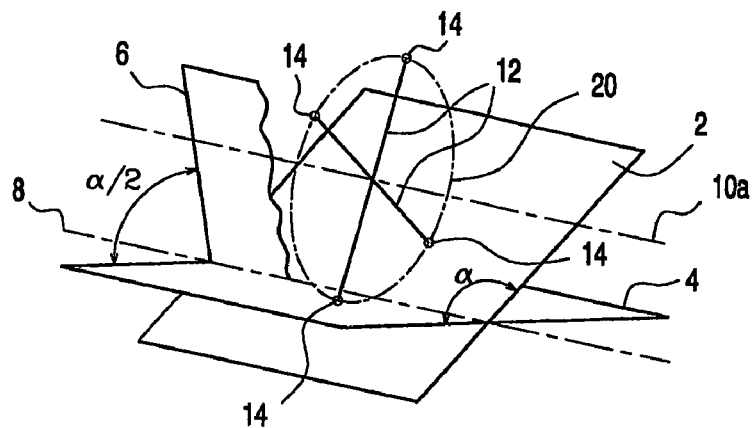
Figure 2:
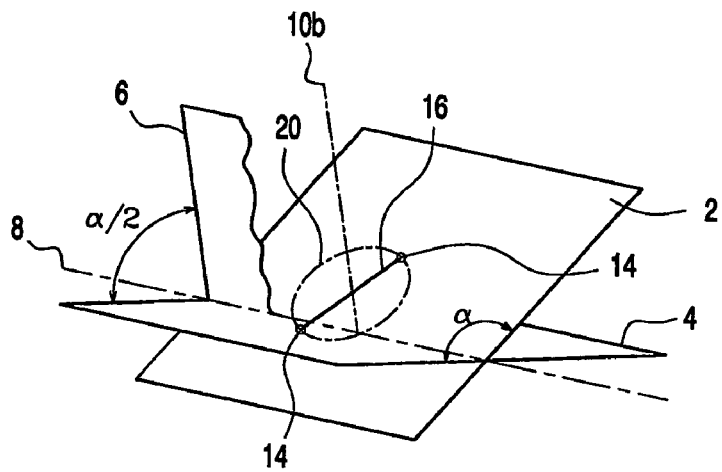
Figure 3:
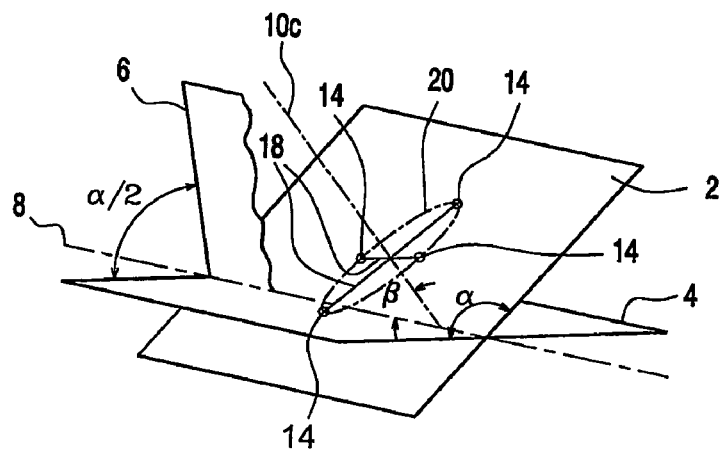

FIGS. 1-3 symbolically illustrate the orientation of different imaginary planes to enable an explanation of the orientation of various components of the chip transfer apparatus according to the invention. A first plane 2 (which is deemed to represent an imaginary plane in which chips surfaces of a wafer extend) is oriented relative to a second plane 4 (which is deemed to represent an imaginary plane in which one or more bond surfaces of respective lead frames extend) at an angle $\alpha(0°<\alpha<180°)$. An imaginary third plane 6 is oriented at an angle $\alpha/2$ both relative to the first plane 2 and the second plane 4. The first plane 2, the second plane 4 and the third plane 6 intersect at an imaginary intersection line 8.

In FIG. 1, an axis 10a, which is deemed to represent an axis of rotation of a rotating assembly 12 comprising four transfer heads 14, extends parallel to the intersection line 8, and in the third plane 6. In FIG. 2, an axis 10b, which is deemed to represent an axis of rotation of a rotating assembly 16 comprising two transfer heads 14, extends at right angles to the intersection line 8, and in the third plane 6. In FIG. 3, an axis 10c, which is deemed to represent an axis of rotation of a rotating assembly 18 comprising four transfer heads 14, extends at an angle $\beta(0°<\beta<90°)$ to the intersection line 8, and in the third plane 6.

From FIGS. 1-3, it is clear that the transfer heads 14 may be moved along a circle 20 indicated by a dash-dotted line, where each transfer head 14 may be taken in a chip pick-up position near the first plane 2, and in a chip bonding position near the second plane 4 along the circle 20, transferring each chip either in a clockwise or a counter-clockwise direction from a wafer to a lead frame. In the arrangements of FIGS. 1-3, with a proper choice of angles α and β and the radius of the circle 20, and a corresponding arrangement of transfer heads 14 along the circle 20, an optimum configuration in a limited space can be obtained.

Preferably, but not necessarily, the number of transfer heads 14 is even, and the spacing of the transfer heads 14 along the circle 20 is regular: when the rotating assembly comprises e.g. two transfer heads 14 (FIG. 2), they are preferably spaced at 180° from each other. When the rotating assembly comprises e.g. four transfer heads 14 (FIGS. 1, 3), they are preferably spaced at 90° from each other. Thus, consecutive transfer heads 14 along the circle 20 always arrive at the same positions along the circle 20 after rotating the assembly 12, 16, 18 about an angle corresponding to the spacing of the transfer heads.

FIGS. 4-7 show a chip transferring apparatus 30 comprising four transfer heads 40a, 40b, 40c and 40d mounted on a rotatable transfer assembly 32. For a better understanding of the chip transferring apparatus 30, the first plane 2, second plane 4, and axis 10a (see also FIG. 1) are indicated in FIGS. 4-7. The rotatable transfer assembly 32 is adapted to rotate about the axis 10a, driven by a motor 31 (FIG. 7) comprising a stator 31a, a magnet ring 31b, a coil block 31c, a cooling body 31d, and a rotor 31e fixedly connected to the magnet ring 31b, and supported relative to the stator 31a by bearings 31f. It is noted that the angle α between the first plane 2 and the second plane 4 is 90°, which is equivalent to the angle between adjacent transfer heads 40a-40d. In the first plane 2, a surface of a chip 42 being part of a wafer 44 may be positioned opposite a transfer head 40a-40d in a chip pick-up position by moving the wafer 44 (to be more precise: its carrier film to which the chips 42 are non-permanently adhered) in any of the directions of double arrows 46, 48 by positioning means which are known per se, and are not shown in detail. In the second plane 4, a bond surface of a lead frame 50 being part of a lead frame string or other lead frame assembly 52 may be positioned opposite a transfer head 40a-40d in a chip bonding position by moving the lead frame assembly 52 in either one of the directions of double arrow 54 by positioning means which are known per se, and are not shown in detail.

Figure 4:
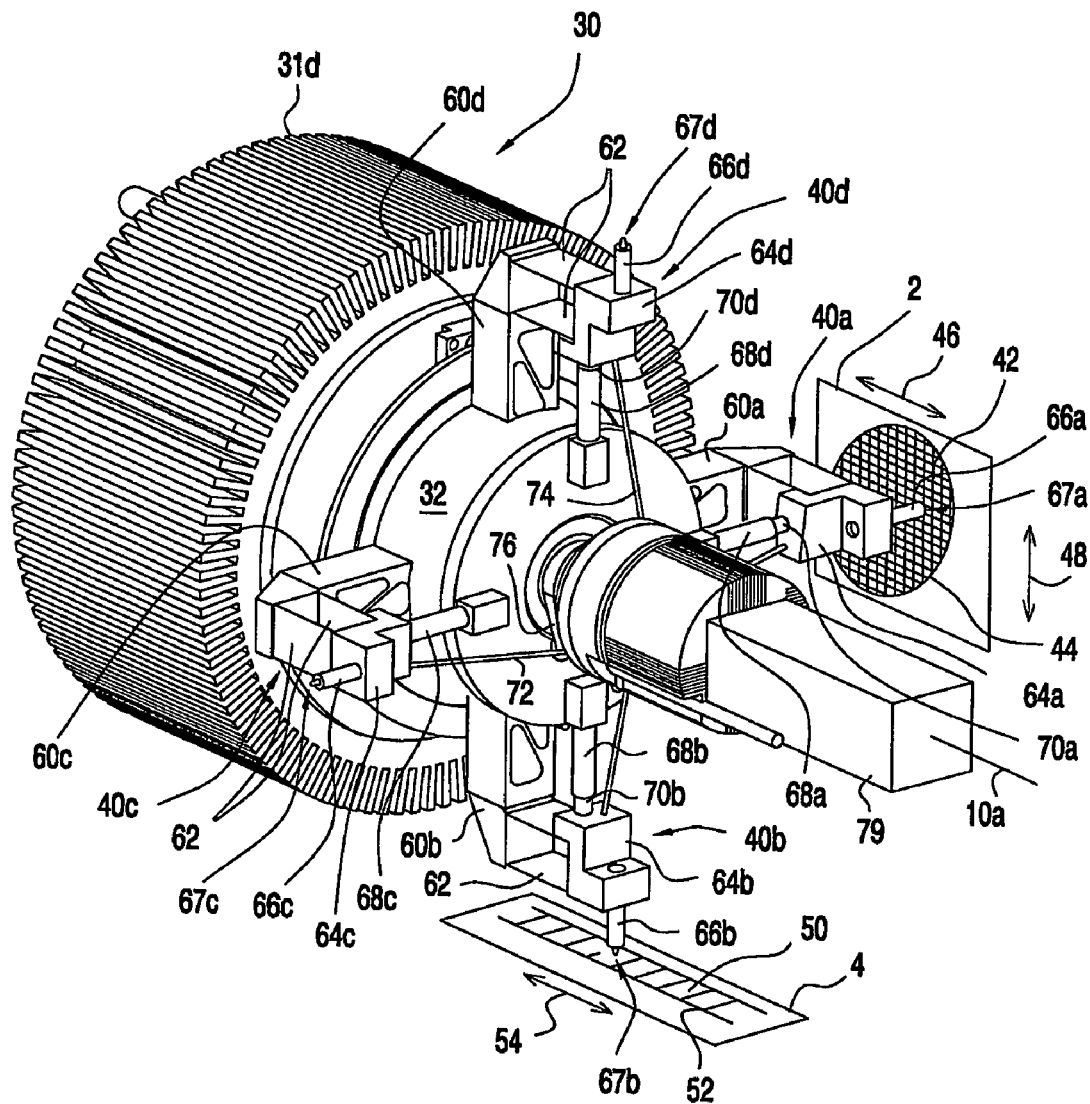
FIG. 4 shows a perspective view of a transferring apparatus according to the invention.
Figure 6:
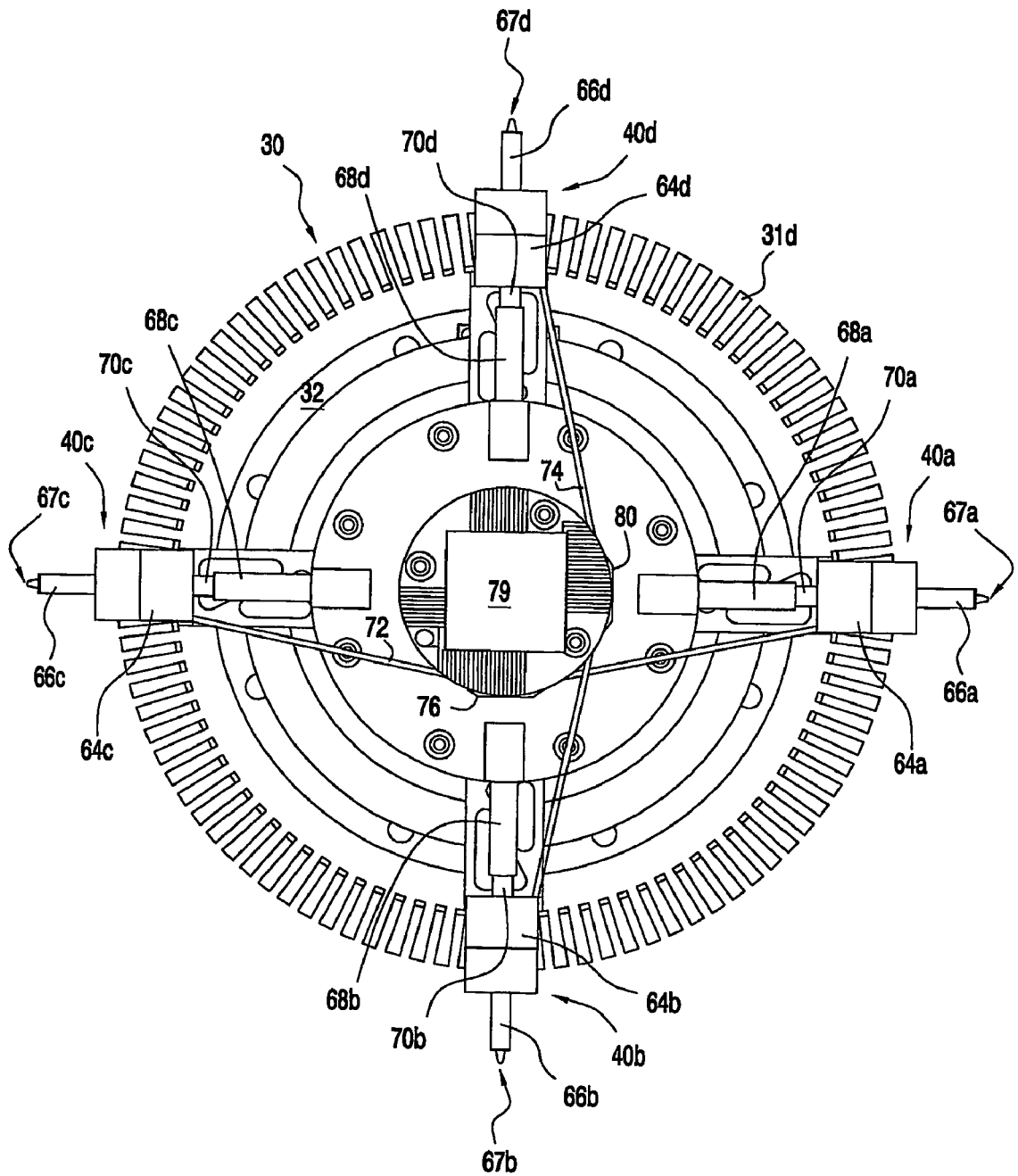
FIG. 6 shows a front view of the transferring apparatus of FIG. 4 on an enlarged scale.
Figure 7:
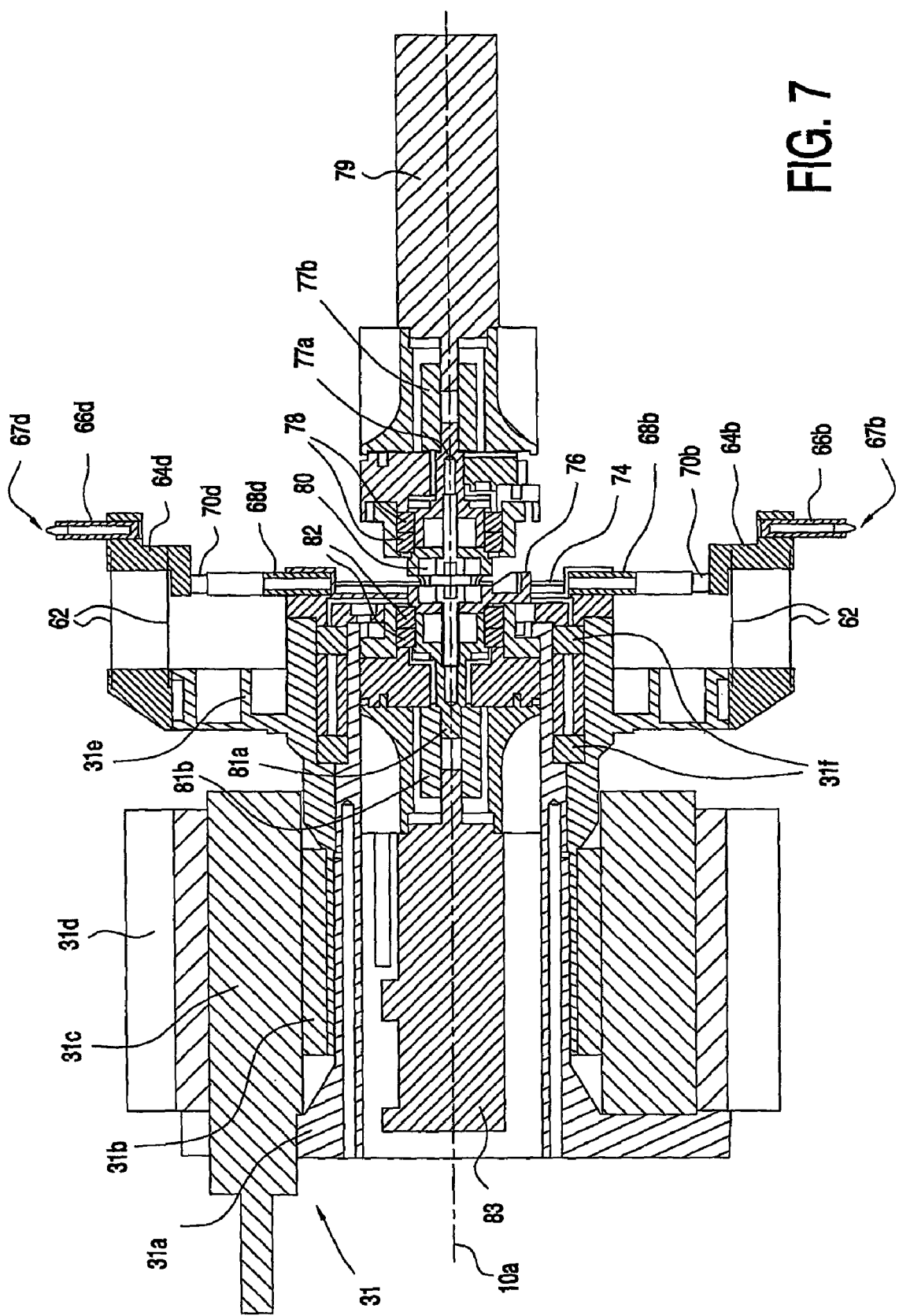
FIG. 7 shows a cross-section of the transferring apparatus of FIG. 4 along the plane VII-VII as indicated in FIG. 5.

The rotating assembly 32 is adapted to be indexed in index steps of 90° about the axis 10a, either clockwise when viewed according to FIG. 6 (e.g. the transfer head 40a moving to the position in which the transfer head 40b is shown in FIG. 4) or counter-clockwise (e.g. the transfer head 40d moving to the position in which the transfer head 40c is shown in FIG. 4). In the clockwise index direction, a chip 42 picked up from the wafer 44 by the transfer head 40a in its position shown in FIG. 4, is bonded to a lead frame 50 after one index step, when the transfer head 40a is in the position shown for transfer head 40b in FIG. 4. In the counter-clockwise index direction, a chip 42 picked up from the wafer 44 by the transfer head 40a in its position shown in FIG. 4, is bonded to a lead frame 50 after three index steps, when the transfer head 40a is in the position shown for transfer head 40b in FIG. 4. Whichever index direction is chosen, every consecutive index step can be useful in transferring a chip 42 from the wafer 44 to the lead frame assembly 52. A difference between the clockwise and the counter-clockwise index direction is that in the counter-clockwise index direction the transfer heads in the positions of the transfer heads 40c and 40d carry a chip 42, whereas in the clockwise index direction they do not. Thus, in the counter-clockwise index direction e.g. an inspection of the position of a chip 42 relative to the transfer head, or an inspection of the structure of the chip 42 at its side formerly facing the carrier film, or any other processing of the chip 42 can be performed in any of the positions shown for the transfer heads 40c and 40d in FIG. 4.

Figure 5:
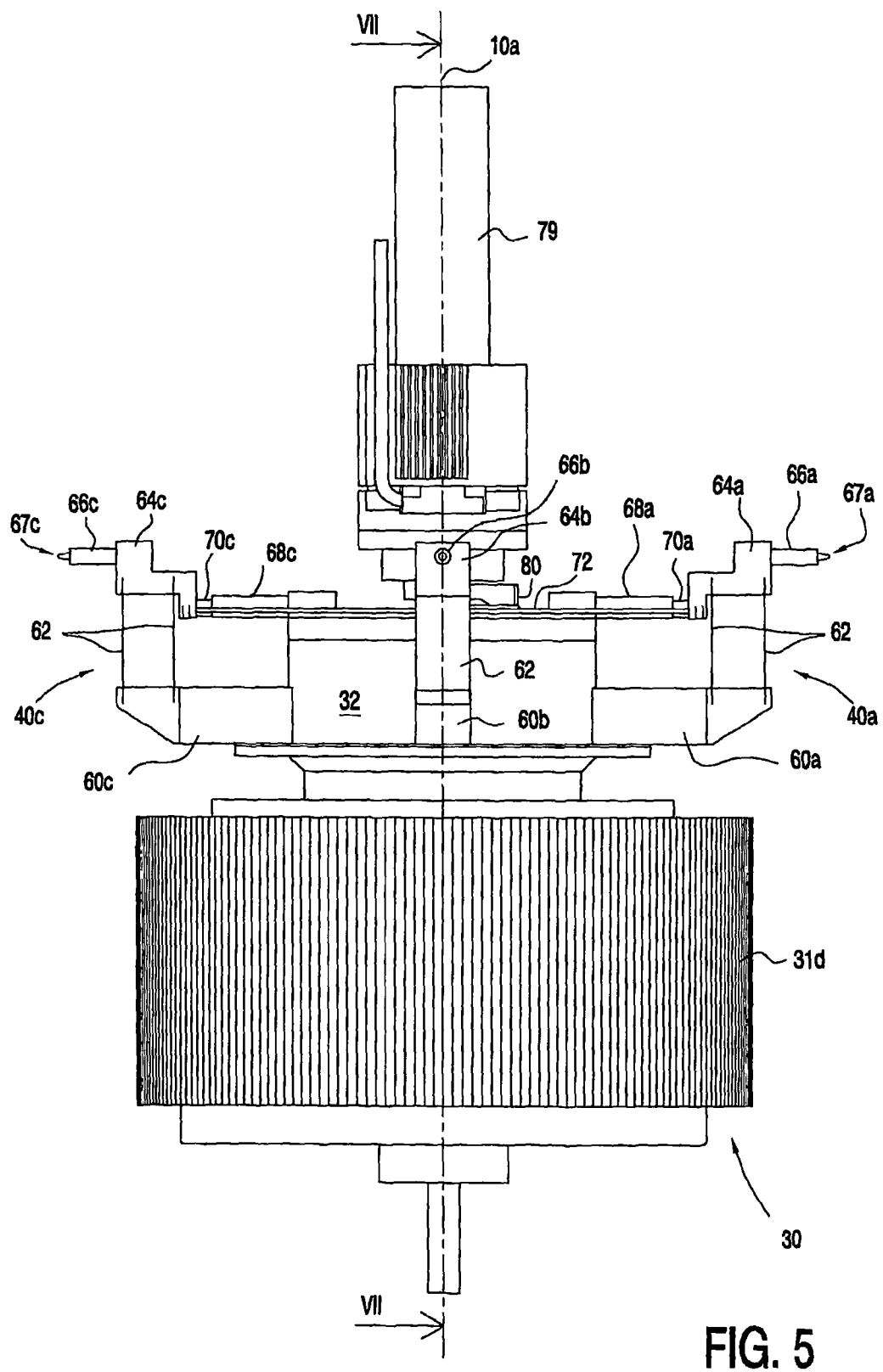
FIG. 5 shows a bottom view of the transferring apparatus of FIG. 4.

As shown in particular in FIGS. 4-6, each transfer head 40a-40d comprises an arm 60a-60d, respectively, extending essentially radially at right angles to the axis 10a from the rotating assembly 32. The arms 60a-60d have been provided with holes to reduce their weight. Near the free ends of each of the arms 60a-60d, the ends of a pair of parallel leaf springs 62 are fixedly mounted, whereas opposite ends of the pair of leaf springs 62 support blocks 64a-64d, respectively. In each block 64a-64d a collet 66a-66d, respectively, is fixedly mounted. Each collet 66a-66d is movable to and fro over a short distance essentially in the radial direction at right angles to the axis 10a. Each transfer head 40a-40d further comprises an arm 68a-68d, respectively, extending essentially radially at right angles to the axis 10a from the rotating assembly 32. Pressure springs 70a-70d are mounted between the ends of the arms 68a-68d and the respective blocks 64a-64d.

The block 64a is connected to the block 64c by a wire 72, whereas the block 64b is connected to the block 64d by a wire 74. In its center part, the wire 72 is fixedly connected, e.g. clamped, to a lever 76 which in turn is fixedly connected to coupling parts 77a, 77b supported by bearings 78, as shown in more detail in FIG. 7. The coupling parts 77a, 77b are fixedly connected to a rotatable shaft driven by a motor 79. In its center part, the wire 74 is fixedly connected, e.g. clamped, to a lever 80 which in turn is fixedly connected to coupling parts 81a, 81b supported by bearings 82. The coupling parts 81a, 81b are fixedly connected to a rotatable shaft driven by a motor 83 accommodated in a hollow space inside the motor 31. Both levers 76 and 80 connected to motors 79 and 83 can be driven independently from each other and independently from the motor 31 about the axis 10a. The wires 72 and 74 are under pretension from the springs 70a, 70c and 70b, 70d, respectively. At minimum, the pretension force should be kept greater than the bonding force to be applied on a chip 42 on a lead frame 50 by the collet of a transfer head in the position of transfer head 40b in FIG. 4.

During rotation of the rotating assembly 32 by the motor 31, the levers 76, 80 are driven at the same rotational speed by their motors 79, 83, respectively, to keep the blocks 64a-64d in a predetermined radial position relative to the axis 10a. For a speed and angular position control, the respective motors are provided with suitable incremental measuring systems known per se, and not shown in the drawings. Since two opposite blocks 64a, 64c and 64b, 64d are connected with each other by the wires 72 and 74, respectively, any centrifugal forces during rotation of the rotating assembly 32 are compensated, and need not be generated by the motors 79, 83. The blocks 64a-64d can be displaced radially inward or outward by creating a difference in angular position between the shaft of the motor 31 and any of the shafts of the motors 79 and 83. By choosing the stiffness of the springs 70a-70d low, the pretension force can be kept relatively constant during a displacement of any of the blocks 64a-64d, which force is to be generated by the motor 79 or 83. No drives for moving the blocks 64a-64d need be mounted on the rotating assembly 32 itself, and consequently no power supply from the stationary environment of the transferring apparatus 30 to the rotating assembly 32 is necessary, keeping the structure simple and lightweight.

FIG. 8 shows a part of transfer assembly 32 which is rotatable around a transfer assembly stator 100 in either direction of double arrow 102. A narrow gap 104, preferably with a width of at most 20 μm, in particular about 15 μm, is provided between the rotatable transfer assembly 32 and the transfer assembly stator 100. The transfer assembly stator 100 is provided with groove sections 106 extending in the circumferential direction. Each groove section 106 is in communication with a first duct 108 extending in a longitudinal direction of the transfer assembly stator 100. In turn, the first ducts 108 can be brought in communication with a low pressure (lower than environmental pressure) source (not shown in detail) connected to a line 110, an environmental pressure source connected to a line 112, and a high pressure (higher than environmental pressure) source connected to a line 114, through lines 116a-116d, 118a-118d, 120a-120d and 122a-122d and corresponding controllable valves 116e-116g, 118e-118g, 120e-120g, and 122e-122g, respectively. In FIG. 8, all lines are shown in dashed lines. Preferably, the sources handle air, but any other suitable gas may be used, depending mainly on the environmental atmosphere of the apparatus.

The rotatable transfer assembly 32 carries second ducts 124 which at one end are in communication with the gap 104 through corresponding circumferentially extending bridging grooves 126. At the other ends, the second ducts 124 are adapted to be connected to a collet of a transfer head of the rotatable transfer assembly 32 to be in communication with a pick-up opening of the collet.

In FIGS. 4-7, the location of pick-up openings of collets 66a-66d has been indicated with 67a-67d, respectively. However, the first ducts 108 and second ducts 124, and other ducts leading from the transfer assembly stator 100 to the pick-up openings 67a-67d are not shown in the embodiment of FIGS. 4-7, but indeed may be present therein.

In FIG. 8 four groove sections 106, four first ducts 108, four second ducts 124 and four bridging grooves 126 are shown, but this number may be any integer number greater than one, corresponding to the number of transfer heads/pick-up openings. Further, it is observed here, that parts of FIG. 8 are not drawn to scale relative to each other, and that FIG. 8 is primarily intended to explain the principle of the gas pressure transfer from the transfer assembly stator 100 to the rotatable transfer assembly 32. The angular extension of the groove sections 106 and the bridging grooves 126 may vary. The width of the gap 104 is chosen to essentially prevent gas from leaking through the gap 104 from one groove section 106 to another when the groove sections 106 are not bridged by the bridging grooves 126.

In operation, any of the second ducts 124 may be brought in communication with any of the lines 110, 112 or 114 when its corresponding bridging groove 126 is opposite to any of the groove sections 106 by actuating any of the appropriate valves 116e-116g, 118e-118g, 120e-120g, or 122e-122g. At the same time, the others of the second ducts 124 may also be brought in communication with any of the lines 110, 112 or 114 when its corresponding bridging groove 126 is opposite to any of the other groove sections 106 by actuating any of the appropriate valves 116e-116g, 118e-118g, 120e-120g, or 122e-122g. By actuating any of valves 116e, 118e, 120e and 120e, a low pressure can be generated in a particular second duct 124 for picking up and holding a chip at the corresponding pick-up opening. By actuating any of valves 116f, 118f, 120f and 120f, an environmental pressure can be generated in a particular second duct 124 for releasing a chip at the corresponding pick-up opening. By actuating any of valves 116g, 118g, 120g and 120g, a high pressure can be generated in a particular second duct 124 for releasing a chip at the corresponding pick-up opening.

When a pressure is to be retained at a pick-up opening during a rotary movement of the rotatable transfer assembly 32, the bridging groove 126 which is in communication with the pick-up opening will, in the area of two adjacent groove sections 106, connect the groove sections 106 with each other and retain the pressure if the adjacent groove sections 106 are in communication with the same line 110, 112 or 114.

FIGS. 9a-9e schematically show a rotatable assembly 200 comprising two transfer heads 202. The rotatable assembly 200 has an axis of rotation 204, as further indicated by the curved arrow 206. Each transfer head 202 comprises a collet 208, which is supported by a movable parallel arm support 210. Each movable arm support 210 may comprise a pair of leaf springs 210a, 210b. The collet 208 thus is movable essentially along a curved dash-dotted line of action indicated in FIG. 9a by reference numeral 211, while retaining its orientation parallel to a dash-dotted line 213 relative to the axis of rotation 204. Further, each collet 208 has a pick-up opening 212 situated at its side adapted to be facing a chip 214 to be picked up. The pick-up opening 212 may be in communication with one or more sources of gas pressure, e.g. as shown and described in relation to FIG. 8, or any other equipment performing the same functions. From the end of the parallel arm support 210 facing the axis of rotation 204 an electrical contact member 216 extends, and from the end of the parallel arm support 210 facing the collet 208 an electrical contact member 218 extends. The contact members 216 and 218 may be in contact with each other, as e.g. shown in FIGS. 9a and 9d, and may not be in contact with each other, as e.g. shown in FIGS. 9b and 9c. A plurality of chips 214 have been placed on a carrier film 220, which in turn is retained on a vacuum head 222. The vacuum head 222 accommodates a needle 224 which can be moved in a direction 224a towards the collet 208 through the vacuum head 222, and in an opposite direction 224b away from the collet 208, by a drive 226. A chip 214 picked up by the collet 208 from the carrier film 220 may be transferred to a chip bonding position, as indicated by the block 228.

The rotatable assembly 200 may be used in a chip transfer apparatus schematically indicated in FIG. 1b or FIG. 1c, for which the orientation 213 of the collets 208 would be at an angle>0° to the axis of rotation 204, but the orientation 213 may also be parallel to the axis of rotation 204. For convenience, the latter situation has been depicted in FIGS. 9a-9e, and will form the basis of the following description of the operation of the pick-up assembly. Although the plane in which the surfaces of the chips 214 facing the collet 208 extend has been depicted in FIGS. 9a-9e as running horizontally, it may assume other orientations as well, e.g. vertical, or in between a horizontal and a vertical position. The orientation 213 of the collets 208 would be adapted to the orientation of said plane so as to be generally at right angles to said plane. To be more precise, a plane of the pick-up opening 212 should be essentially parallel to said chips surfaces plane, irrespective of the orientation 213 of the collets 208, for ensuring that a chip 214 can be held firmly when it is peeled off from the carrier film 220, as will be explained below.

Figure 9A:
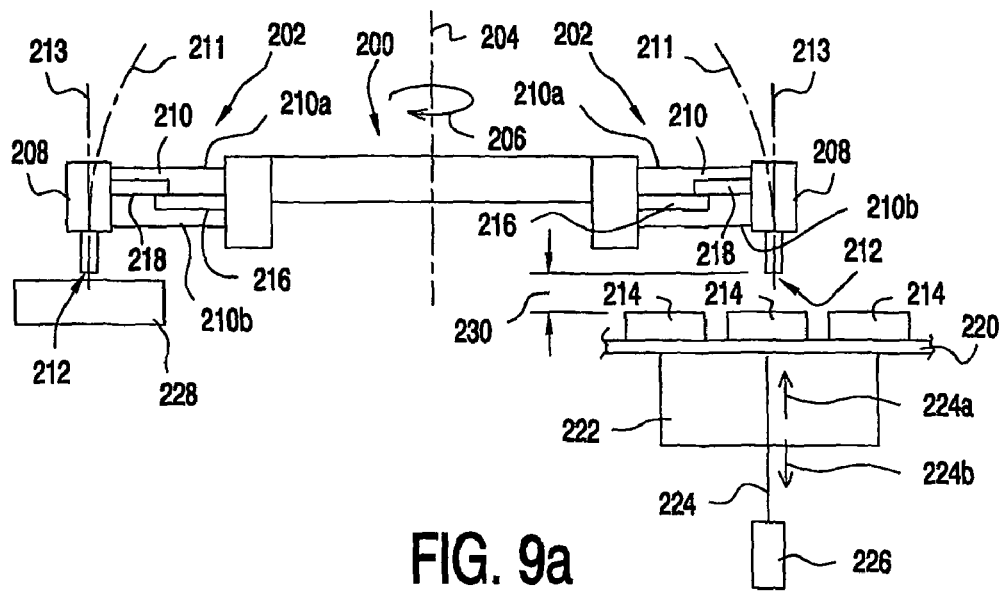

Further it is observed that the rotatable assembly 200 may also comprise only one transfer head 202, which in the case of FIG. 9a would mean that the elements shown at the left hand side of the axis of rotation 204 would be absent.

As illustrated in FIG. 9a, in the operation of the pick-up assembly, first a chip 214 on the carrier film 220 held by the vacuum head 222, and a collet 208 are positioned opposite to one another. For this process a vision system may be used, providing control signals for positioning the collet 208 and the chip 214. The contact members 216 and 218 are in contact with each other, which may be detected by a control circuit (not shown) connected to the contact members 216, 218.

Figure 9B:
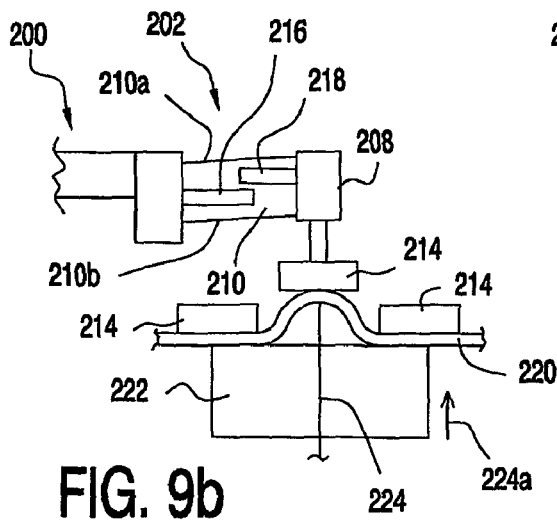
Figure 9C:
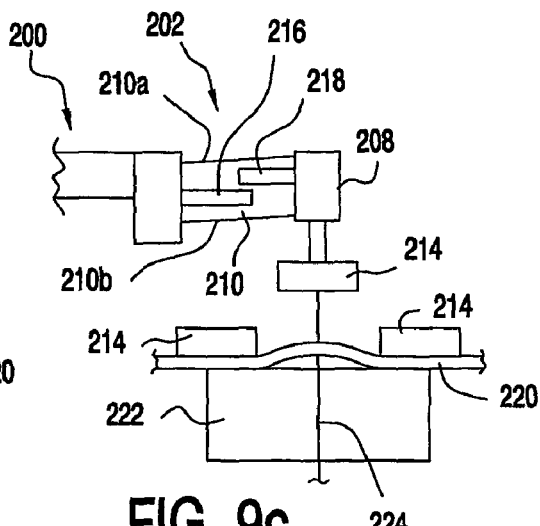

As illustrated in FIGS. 9b and 9c, next the needle 224 is moved in the direction 224a, through the carrier film 220, pushing up the chip 214 from the carrier film 220, which is locally deformed. The rest of the carrier film 220 is retained on the vacuum head 222, with the result that the chip 214 peels off from the carrier film 220. As indicated in FIG. 9a, a distance 230 is needed to peel the chip 214 essentially off the carrier film 220, where the larger the chip 214 is, the longer the distance 230 is. After the chip 214 has hit the collet 208 at its pick-up opening 212, the movable arm support 210 enables the collet 208 to move in the direction 224a. This collet movement opens the contact of the contact members 216 and 218, which may be detected by said control circuit, and used as a reference to initiate a next action, explained below with reference to FIG. 9d.

FIG. 9b illustrates the peeling off of the chip 214 from the carrier film 220, whereas FIG. 9c illustrates the time when the chip 214 has completely peeled off from the carrier film 220. The chip is held by the collet 208 by creating a low (sub-environmental) pressure at its pick-up opening 212. After the detection of the opening of the contact of the contact members 216, 218 (FIG. 9b) a predetermined time period may be waited in order to ensure a complete peeling off of the chip 214 from the carrier film 220 (FIG. 9c).

Figure 9D:
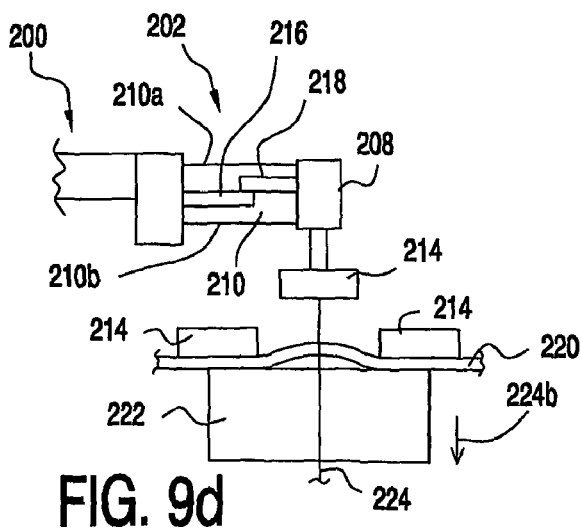

As illustrated in FIG. 9d, after said waiting time period has elapsed, both the vacuum head 222 and the needle 224 are moved in the direction 224b, whereby the needle 224 will move into the vacuum head 222. The contact members 216, 218 contact each other again, which contact may be detected by said control circuit as a reference to initiate a rotation of the rotatable assembly 200 for transferring the chip 214 fixed by the collet 208 of the corresponding transfer head 202 to the bonding position 228.

However, said waiting time need not to be taken as long as to completely peel the chip 214 off from the carrier film 220. If the distance 230 is chosen less than the distance to completely peel the chip 214 off from the carrier film 220, advantageously the movement of the vacuum head 222 in the direction 224b is used to complete the peeling off, thus reducing the pick-up cycle time.

Figure 9E:
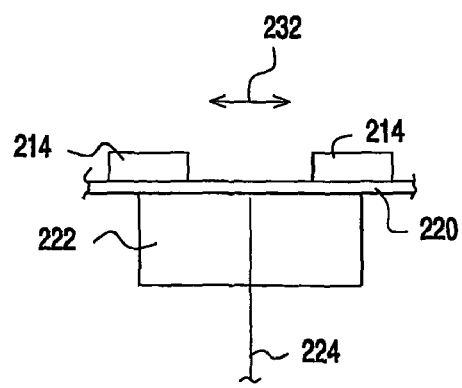

Next, as illustrated in FIG. 9e, the vacuum head 222 releases the carrier film 220, which is then moved in either one of the directions indicated with double arrow 232 and/or at right angles to the double arrow 232 and the directions 224a, 224b in order to bring a next chip 214 opposite a collet 208. The vacuum head 222 is returned to its original position (as seen in the direction 224a) of FIG. 9a and will hold the carrier film 220 again. The steps described above may be repeated for the next chip 214.

A chip transferring apparatus has been described which has an increased throughput by a compact design, reducing transfer travelling time, and by employing at least two chip transfer heads, both making a useful operation at each transfer movement thereof. In the described chip transferring apparatus, centrifugal forces on collets of a rotatably driven transfer assembly are compensated by counterweights being mechanically coupled to the collets, in particular by other collets being mechanically coupled to the former collets. The mechanical coupling may be driven independently from the transfer assembly to obtain a weight reduction of the latter. The described transfer apparatus is provided with an individual pressure control at each collet, the pressure being transferred from a stationary pressure source to the moving collet without the use of traditional seals. The described transfer apparatus provides for a faster transfer operation by reducing the time needed for a chip pick-up process.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of other elements or steps than those listed in a claim. The word "a" or "an" preceding an element does not exclude the presence of a plurality of such elements.

The invention claimed is:

1. Apparatus for transferring chips from a wafer to a lead frame, comprising:
   a wafer-positioning device for positioning a wafer, the wafer comprising chips surfaces thereof extending in a first plane, the first plane having a front face and a back face, the chips surfaces exposed on the front face of the first plane;
   a lead frame positioning device for positioning a lead frame, the lead frame comprising a bond surface thereof, the bond surface extending in a second plane which is different from the first plane, the second plane having a front face and a back face, the bond surface exposed on the front face of the second plane, the front face of the second plane facing the front face of the first plane, either parallel (180°) or intersecting at an intersection line to form a dihedral angle of greater than 0° and less than 180°;
   a rotatable transfer assembly comprising at least two transfer heads, a first transfer head for picking up a first chip from the wafer in a chip pick-up position, and a second transfer head for bonding a second chip to the lead frame in a chip bonding position; wherein the rotatable transfer assembly is configured to concurrently rotate the first transfer head toward the chip pick-up position of the first transfer head and the second transfer head toward the chip bonding position of the second transfer head; and
   a transfer assembly motor for driving the rotatable transfer assembly about an axis of rotation, the axis of rotation extending along a line in a third plane, each point of the third plane being both equidistant to and between the front faces of the first and second planes.

2. Apparatus according to claim 1, characterized in that the transfer heads are rotatable essentially along a complete circle in a fourth plane, wherein the fourth plane is at right angles to the axis of rotation of the transfer assembly.

3. Apparatus according to claim 2, characterized in that the transfer heads are spaced regularly along said circle.

4. Apparatus according to claim 1, characterized in that the number of transfer heads is four.

5. Apparatus according to claim 1, characterized in that the transfer assembly is rotated in only one direction.

6. Apparatus according to claim 1, characterized in that each transfer head comprises a collet which, in the chip pick-up position, is movable in a direction essentially at right angles to the first plane, and in the chip bonding position, is movable in a direction essentially at right angles to the second plane.

7. Apparatus according to claim 6, characterized in that the transfer assembly comprises a counterweight for each collet, each collet being coupled to its corresponding counterweight through a mechanical coupling for compensating radial forces exerted on the collet relative to said axis of rotation.

8. Apparatus according to claim 7, characterized in that the mechanical coupling is adapted to be driven by a collet drive motor for moving the collet radially relative to said axis of rotation.

9. Apparatus according to claim 8, characterized in that the transfer assembly motor has the same axis of rotation as the collet drive motor.

10. Apparatus according to claim 7, characterized in that the counterweight for one collet is another collet of the transfer assembly.

11. Apparatus according to claim 10, characterized in that said one collet is situated oppositely relative to said other collet with respect to said axis of rotation.

12. Apparatus according to claim 7, characterized in that the mechanical coupling is a wire.

13. Apparatus according to claim 12, characterized in that a support of each collet relative to the transfer assembly comprises a pressure spring pretensioning the wire.

14. Apparatus according to claim 13, characterized in that the pressure spring has a low stiffness.

15. Apparatus according to claim 13, characterized in that the pretension force is greater than a bonding force to be applied on a chip on a lead frame by the collet of a transfer head.

16. Apparatus according to claim 1, characterized in that the rotatable transfer assembly is rotatable around a transfer assembly stator, a narrow circumferential gap being provided between the rotatable transfer assembly and the transfer assembly stator, the transfer assembly stator comprising groove sections facing the gap for at least the chip pick-up position and the chip bonding position, respectively, each groove section extending in the circumferential direction and being in communication with a first gas duct, each transfer head of the rotatable transfer assembly comprising at least one collet having a pick-up opening, the pick-up opening being in communication with the gap through a second gas duct.

17. Apparatus according to claim 16, characterized in that the number of groove sections is equal to the number of transfer heads.

18. Apparatus according to claim 16, characterized in that each first duct is provided with a controllable valve.

19. Apparatus according to claim 16, characterized in that the second gas duct at its end facing the gap is provided with a bridging groove extending in the circumferential direction, the bridging groove being adapted to bridge two adjacent groove sections of the transfer assembly stator.

20. Apparatus according to claim 1, wherein the two front faces intersect at the intersection line, the third plane bisects the dihedral angle, and the axis of rotation is at an offset angle of at least 0° and at most 90° with respect to the intersection line.

21. Apparatus according to claim 20, characterized in that the dihedral angle is 90°.

22. Apparatus according to claim 20, characterized in that the offset angle is 0°.

* * * * *